(12) United States Patent
Yuan et al.

(10) Patent No.: US 10,114,072 B2
(45) Date of Patent: Oct. 30, 2018

(54) PROCESSING METHOD AND ELECTRONIC APPARATUS FOR DIGITAL SIGNAL

(71) Applicant: MStar Semiconductor, Inc., Hsinchu Hsien (TW)

(72) Inventors: Yuan Yuan, Shanghai (CN); Wen cai Lu, Shanghai (CN)

(73) Assignee: MSTAR SEMICONDUCTOR, INC., Hsinchu Hsien (TW)

(*) Notice: Subject to any disclaimer, the term of this patent is extended or adjusted under 35 U.S.C. 154(b) by 0 days.

(21) Appl. No.: 15/679,484

(22) Filed: Aug. 17, 2017

(65) Prior Publication Data

US 2018/0080985 A1  Mar. 22, 2018

Related U.S. Application Data

(60) Provisional application No. 62/397,348, filed on Sep. 21, 2016.

(51) Int. Cl.
| | |
|---|---|
| H04B 17/00 | (2015.01) |
| G01R 31/317 | (2006.01) |
| H04B 17/10 | (2015.01) |
| G06F 1/04 | (2006.01) |
| H04B 10/079 | (2013.01) |
| H04L 1/20 | (2006.01) |
| H03K 5/135 | (2006.01) |
| G01R 31/3193 | (2006.01) |

(52) U.S. Cl.
CPC . G01R 31/31708 (2013.01); G01R 31/31937 (2013.01); G06F 1/04 (2013.01); H03K 5/135 (2013.01); H04B 10/0795 (2013.01); H04B 17/0085 (2013.01); H04B 17/104 (2015.01); H04L 1/20 (2013.01); H04L 1/205 (2013.01)

(58) Field of Classification Search
CPC ......... H04L 1/20; H04L 1/24; H04L 25/0307; H04B 10/0795; H04Q 2011/0083
USPC ......... 375/224, 229, 232, 233; 708/322, 323
See application file for complete search history.

(56) References Cited

U.S. PATENT DOCUMENTS

| | | | |
|---|---|---|---|
| 6,934,869 B1* | 8/2005 | Bhoja | H03L 7/091 375/376 |
| 2006/0190200 A1 | 8/2006 | Nygaard, Jr. | |
| 2015/0117511 A1* | 4/2015 | Lyubomirsky | H04L 25/03057 375/233 |

(Continued)

FOREIGN PATENT DOCUMENTS

TW          201421923          6/2014

OTHER PUBLICATIONS

Taiwan Patent Office "Office Action" dated May 22, 2018, Taiwan.

*Primary Examiner* — Khai Tran
(74) *Attorney, Agent, or Firm* — WPAT, PC

(57) ABSTRACT

A processing method and electronic apparatus for a digital signal are provided. The method includes: detecting the quality of a first eye in an eye diagram of the digital signal; equalizing the digital signal; detecting the quality of a second eye in the eye diagram of the equalized digital signal; determining whether the quality of the second eye superior to the quality of the first eye by a predetermined threshold; and if so, outputting the digital signal, or else again equalizing and performing subsequent steps on the auto-compensated digital signal. The above solution is capable of effectively improving the quality of eyes in the eye diagram of the digital signal.

10 Claims, 6 Drawing Sheets

(56) References Cited

U.S. PATENT DOCUMENTS

2016/0191275 A1\* 6/2016 Lyubomirsky .... H04L 25/03057
398/25

\* cited by examiner

PROCESSING METHOD AND ELECTRONIC APPARATUS FOR DIGITAL SIGNAL

This application claims the benefit of U.S. Provisional Application Ser. No. 62/397,348, filed Sep. 21, 2016, the subject matter of which is incorporated herein by reference.

BACKGROUND OF THE INVENTION

Field of the Invention

The invention relates in general to the field of signal processing, and more particularly to a processing method and an electronic device for a digital signal.

Description of the Related Art

Digital signals are extensively applied in various industries. Due to transmission channels or other issues of a transmission system, a digital signal received by a receiver is often impaired by interference. For example, a digital signal, e.g., a multimedia file, which is transmitted from a transmitter and received by an electronic apparatus via a DisplayPort (DP), is susceptible to damages due to channel transmission or other issues. As a result, eyes in an eye diagram of the digital signal cannot open up, such that the electronic apparatus fails to obtain a correct response according to the digital signal, such as correctly playing the multimedia file.

Therefore, there is a need for a solution for processing a digital signal to improve the quality of eyes in an eye diagram of a digital signal.

SUMMARY OF THE INVENTION

The disclosure is directed to providing a signal processing method and an electronic device for a digital signal to effectively improve the quality of eyes in an eye diagram of a digital signal.

According to an aspect of the present invention, the disclosure provides a processing method for a digital signal. The method includes detecting the quality of a first eye in an eye diagram of the digital signal, equalizing the digital signal, detecting the quality of a second eye in the eye diagram of the equalized signal, determining whether the quality of the second eye is superior to the quality of first eye by a predetermined threshold; if so, outputting the digital signal; and if not, again equalizing and performing the subsequent steps on the auto-compensated digital signal.

According to another aspect of the present invention, the application provides an electronic apparatus. The electronic apparatus, connected to a memory, includes: a detector, detecting the quality of a first eye in an eye diagram of a digital signal; an equalizer, connected to the detector, equalizing the digital signal, wherein the detector further detects the quality of a second eye in the eye diagram of the equalized digital signal; a processor, connected to the detector and the equalizer, executing a computer instruction to perform operations of: determining whether the quality of the second eye is superior to the quality of the first eye by a predetermined threshold; if so, outputting the digital signal; and if not, causing the equalizer to again equalize the digital signal, causing the detector to again detect the quality of the second eye in the eye diagram of the equalized digital signal, again determining whether the quality of second eye is superior to the quality of the first eye by the predetermined, and performing a corresponding process according to the determination result.

In the above solutions, the quality of eyes in an eye diagram is improved by equalizing the digital signal. The qualities of the eyes obtained before and after equalizing the digital signal are compared, and the digital signal is again equalized if the quality of the eyes of the equalized digital signal is not superior to the quality of the eyes of the digital signal before the equalization by a predetermined threshold. Only when the quality of the eyes of the final equalized digital signal is superior to the quality of the eyes of the non-equalized digital signal by the predetermined threshold, the digital signal is outputted, thus significantly improving the quality of the eyes of the digital signal.

The above and other aspects of the invention will become better understood with regard to the following detailed description of the preferred but non-limiting embodiments. The following description is made with reference to the accompanying drawings.

DETAILED DESCRIPTION OF THE INVENTION

Details of the solution of the disclosure are given in the embodiments with the accompanying drawings below.

In the description below, for illustration rather than limitation purposes, specific details of predetermined system structures, interfaces and technologies are disclosed to better and more thoroughly understand the disclosure.

In the disclosure, the term "and/or" is merely an association relationship describing associated objects, and indicate three possible relationships. For example, A and/or B may indicate three situations including: A exists independently, A and B exist simultaneously, and B exists independently. Further, the symbol "/" in the disclosure generally indicates that former and latter associated objects have an "or" relationship.

Figure 1:
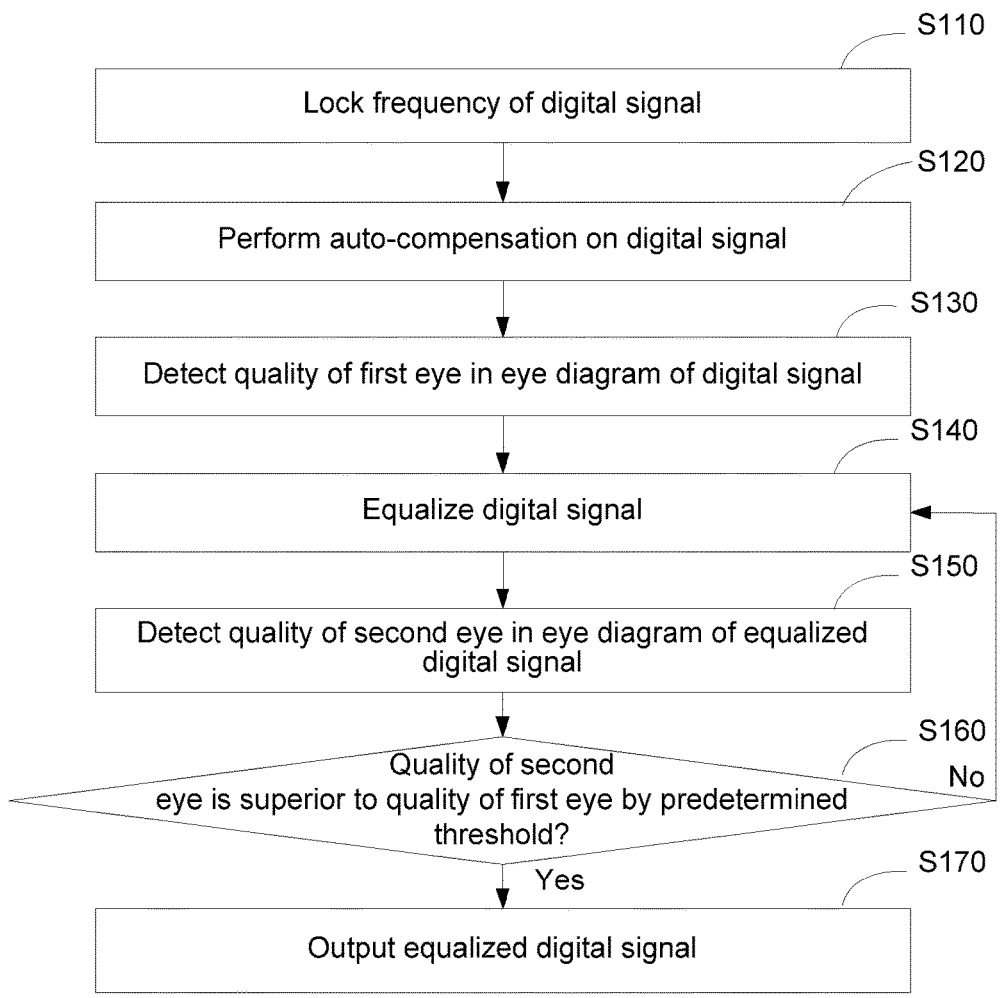
FIG. 1 is a flowchart of a processing method according to an embodiment of the disclosure.

FIG. 1 shows flowchart of a processing method for a digital signal according to an embodiment of the application. In this embodiment, the method includes following steps.

In step S110, the frequency of a digital signal is locked.

For example, in this embodiment, the method is performed by an electronic apparatus. The electronic apparatus receives, via a DisplayPort (DP) interface, a High Definition Multimedia Interface (HDMI) or a Digital Video Interface (DVI), a digital signal transmitted from a transmitter. If the original digital signal is impaired, eyes in an eye diagram of the digital signal cannot fully open or are only open slightly. In this embodiment, the electronic apparatus first locks the frequency of the original digital signal.

It is understandable that, instead of receiving the digital signal via the above interfaces, the electronic apparatus may also generate the digital signal itself. For example, the electronic apparatus is any apparatus with a signal processing capability, such as a television, a set-up box (STB) or a computer.

In step S120, the digital signal is auto-compensated.

In this embodiment, to obtain better quality of the eyes in the eye diagram of the digital signal, the digital signal is first auto-compensated before it is equalized. For example, the electronic apparatus inputs the frequency locked digital signal sequentially to a continuous time linear equalizer (CTLE) and a programmable gain amplifier (PGA). The CLTE and the PGA are for performing auto-compensation. After the auto-compensation, the quality of the eyes in the eye diagram of the digital signal is improved, with the width of the eyes enlarged compared to the original digital signal. However, the effect of the auto-compensation on the digital signal is limited, particularly so for high-speed digital signals. The eye width of the auto-compensated signal is still much smaller than that of an ideal digital signal.

In step S130, the quality of a first eye in the eye diagram of the digital signal is detected.

More specifically, the eye quality may be represented by an eye width. The electronic apparatus may use a phase digital-to-analog converter (DAC) to perform auto-scanning on the auto-compensated digital signal to obtain a first auto-scan result, i.e., eye width information of the eye diagram of the current digital signal. For example, the phase DAC scans two successive eyes in the eye diagram of the digital signal to obtain a first auto-scan result Autoscan1 results shown in FIG. 5. The phase DAC divides one clock cycle into ten equal phases, and obtains after the auto-scan one set of scan results including four good phases and six bad phases. The good phases indicate that the eyes at the corresponding phase positions are open, whereas the bad phases indicate that the eyes at the corresponding phase positions are closed. Thus, the ten phases indicates that the eye widths of the two successive eyes as, the eye width of each eye is equal to two of the phases or is represented as $2/5$.

In step S140, the digital signal is equalized.

Figure 2:
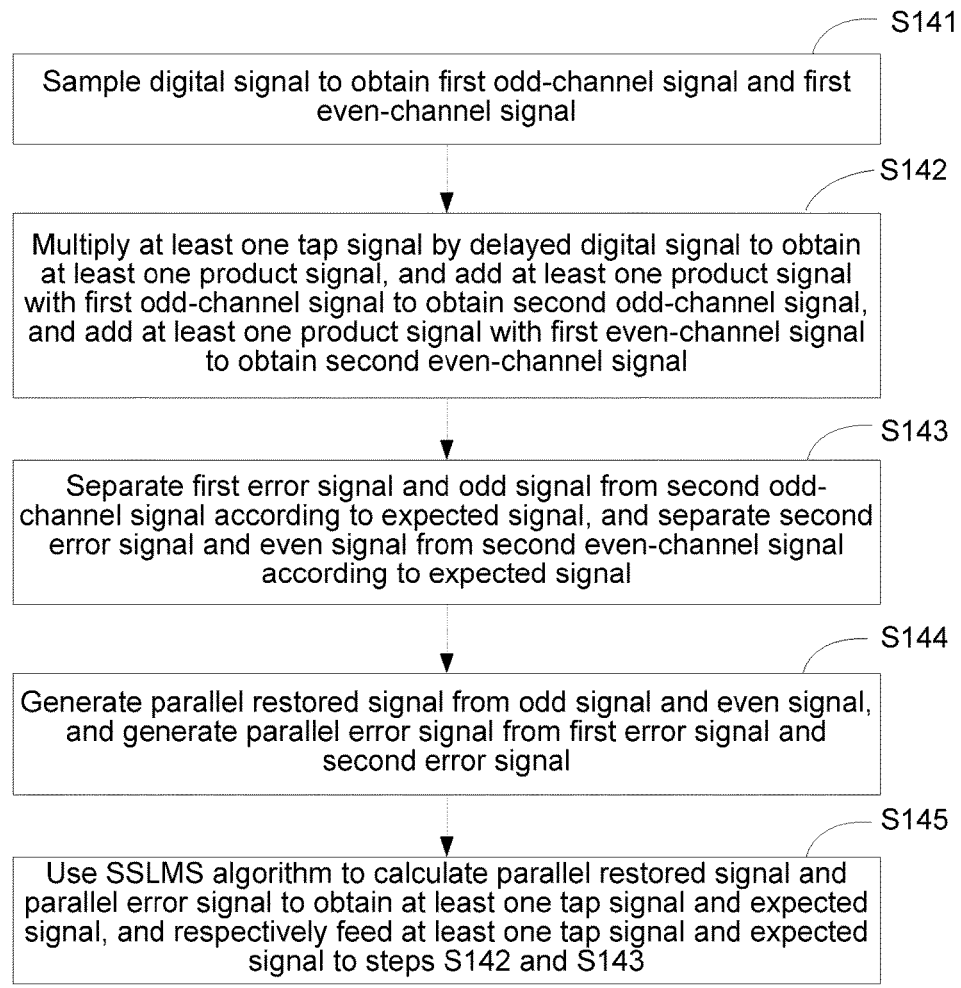
FIG. 2 is a flowchart of an equalization step according to an embodiment of the disclosure.
Figure 3:
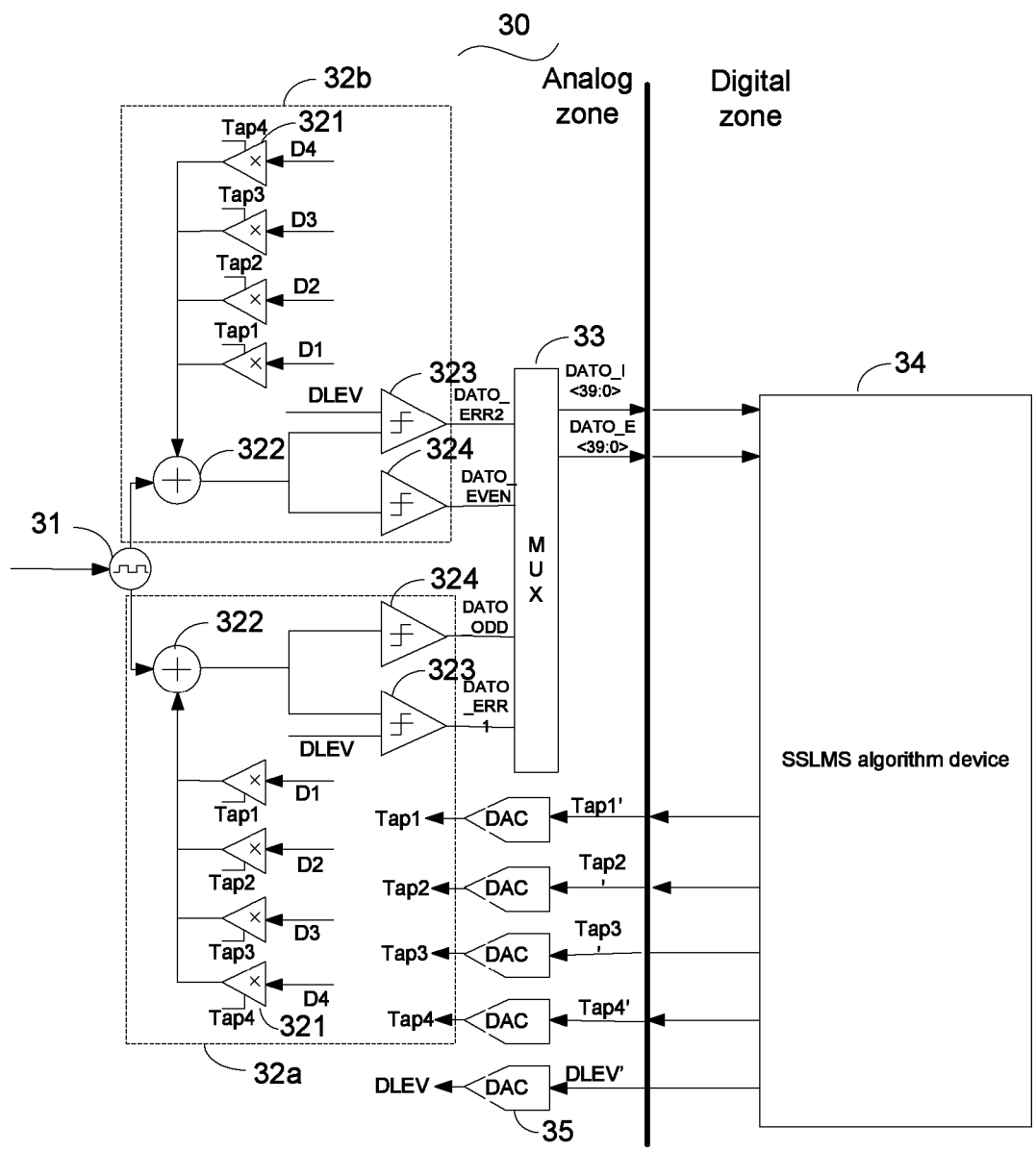
FIG. 3 is a structural schematic diagram of a DFE equalizer adopted in an embodiment of the disclosure.

The equalization may be implemented as decision feedback equalization performed by a decision feedback equalizer (DFE), or equalization performed by a maximum likelihood (ML) symbol detector or by an ML sequence estimation means. In this embodiment, decision feedback equalization is taken as an example. FIG. 2 shows a flowchart of an equalization step according to an embodiment of the application. FIG. 3 shows a schematic diagram of a DFE implementing the process in FIG. 3. Referring to FIG. 2 and FIG. 3, step S140 includes following sub-steps.

In step S141, the digital signal is sampled to obtain a first odd-channel signal and a first even-channel signal.

Figure 4:
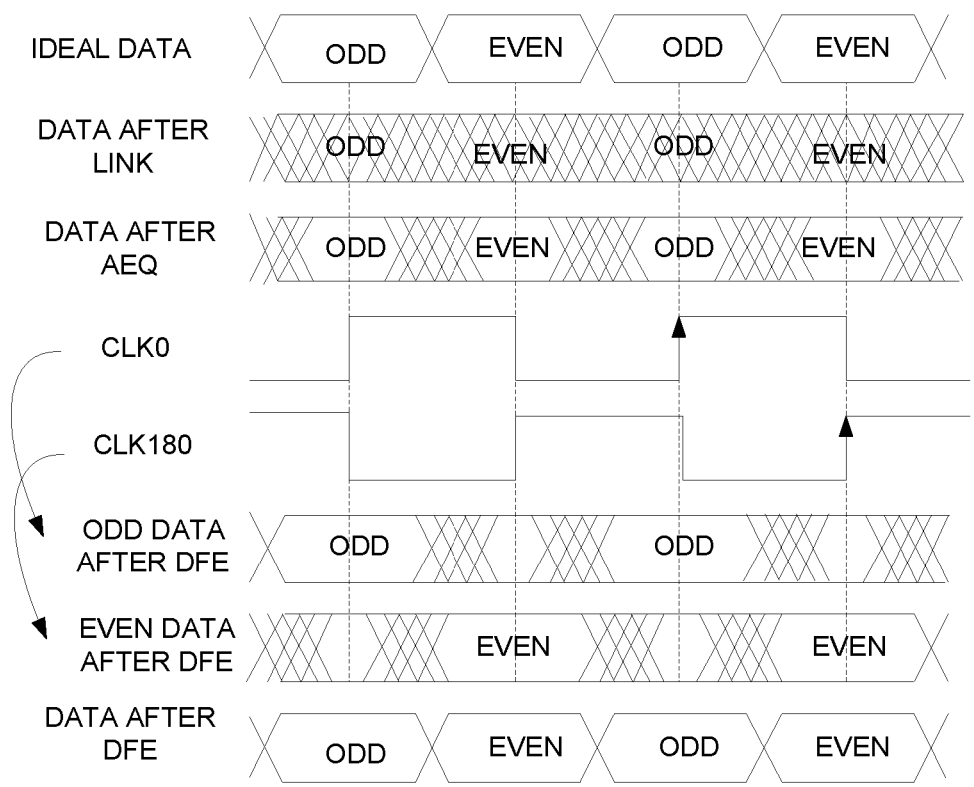
FIG. 4 is a waveform diagram of a digital signal obtained in different steps of the method of the disclosure in an application scenario.

In this embodiment, the DFE adopted is, for example but not limited to, a half-rate DFE. Referring to FIG. 4, the auto-compensated digital signal is inputted to the DFE. The DFE, by using a clock signal CLK0 having 0° phase difference from the clock of the digital signal and a signal period twice of that of the digital signal, samples the inputted digital signal to obtain the first odd-channel signal, which is then inputted to an odd channel 32a for subsequent processing. Further the DFE, by using a clock signal CLK180 having 180° phase difference from the clock of the digital signal and a signal period twice of that of the digital signal, samples the inputted digital signal to obtain the first even-channel signal, which is then inputted to an even channel 32b for subsequent processing. The first odd-channel signal includes an error signal and signal components of odd eyes in the digital signal (to be referred to as an odd signal of the digital signal in the description). The first even-channel signal includes an error signal and signal components of even eyes in the digital signal (to be referred to as an even signal of the digital signal in the description).

In step S142, at least one tap signal is multiplied with a delayed digital signal to obtain at least one product signal, the at least product signal is added with the first odd-channel signal to obtain a second odd-channel signal, and the at least one product signal is added with the first even-channel signal to obtain a second even-channel signal.

In this embodiment, the tap signal is in a plural number, and each tap signal is multiplied with a delayed digital signal to obtain a product signal. The delay periods of the digital signal corresponding to the tap signals are different. The digital signal may be a digital signal at any time point before the equalization, e.g., the digital signal sampled in step S141, or the digital signal initially received at the beginning of the process.

Referring to FIG. 3, each of the odd-channel 32a and the even-channel 32b of the DFE includes at least one multiplier 321 and at least one adder 322.

For each channel, each multiplier 321 thereof multiplies a tap signal with a delayed digital signal to obtain a product signal. The tap signal of each multiplier in each channel is fed back from a sign-sign least mean square (SSLMS) algorithm device 34, and the delay period of the digital signal of each multiplier in the channel differs from that of another. Taking a 4-tap DFE for example, each channel includes four multipliers. A D1 signal delayed by 1 bit, a D2 signal delayed by 2 bit, a D3 signal delayed by 3 bit and a signal D4 delayed by 4 bit of the digital signal are respectively inputted into first input ends. Tap signals Tap1 to Tap4 are respectively inputted into second input ends. The tap signals Tap1 to Tap4 are IDAC current signals obtained from performing digital-to-analog conversion on Tap1' to Tap4' digital signals fed back from the SSLMS. Each multiplier 321 inputs a current signal obtained from multiplying the corresponding inputted tap signal to the adder 322. It is understandable that, the number of tap signals of the DFE, i.e., the number of multipliers in each channel, is not limited. A larger number of taps can be provided in hope of acquiring a better equalization effect, with however increased hardware costs, an enlarged DFE circuit and increased power consumption resulted as a trade-off.

The adder 322 of the odd-channel 32a adds the product signal outputted by the multiplier 321 in the channel with the first odd-channel signal to obtain the second odd-channel signal having an enlarged eye width compared to the first odd-channel signal. The adder 322 of the even-channel 32b adds the product signal outputted by the multiplier 321 of the even-channel 32b with the first even-channel signal to obtain the second even-channel signal with an enlarged eye width compared to the first even-channel signal.

In step S143, a first error signal and a first odd signal are separated from the second odd-channel signal according to an expected signal; a second error signal and an even signal are separated from the second even-channel signal from the expected signal.

In this embodiment, the above separation is performed by using a phase detector. More specifically, each of the odd channel 32a and the even channel 32b of the DFE includes a first analog phase detector 323 and a second analog phase detector 324. In the odd channel 32a, the first analog phase detector 323, by comparing the inputted second odd-channel signal with the expected signal fed back from the SSLMS algorithm device 34, detects and obtains an error signal (referred to as the first error signal in the description) in the second odd-channel signal. The second analog phase detector 324 performs clock data recovery (CDR) on the inputted odd-channel signal, and obtains the odd signal corresponding to the digital signal. In the even channel 32b, the first analog phase detector 323, by comparing the inputted even-channel signal with the expected signal fed back from the SSLMS algorithm device 34, detects and obtains an error signal (referred to as the second error signal in the description) in the second even-channel signal. The second analog phase detector 324 performs CDR on the inputted second even-channel signal, and obtains the even signal corresponding to the digital signal. As shown in FIG. 3, the expected signal may be a voltage signal, which is a voltage signal DLEV obtained from digital-to-analog converting an expected voltage DLEV' fed back by SSLMS.

In step S144, the odd signal and the even signal are combined to generate a parallel restored signal, and the first error signal and the second error signal are combined to generate a parallel error signal.

The above parallel signals may be generated by using a multiplexer. More specifically, the DFE includes a multiplexer 33. In this embodiment, the multiplexer 33 demultiplexes data to generate low-speed parallel data. For example, the multiplexer 33 demultiplexes consecutive high-speed odd signal DATO_ODD and even signal DATO_EVEN outputted from the odd channel and the even channel to obtain low-speed parallel restored signals DATA_I<39:0>, and demultiplexes a first error signal DATO_ERR1 and a second error signal DATO_ERR2 outputted from the odd channel and the even channel to obtain low-speed parallel error signals DATO_E<39:0>.

In step S145, using the SSLMS algorithm, the parallel restored signal and the parallel error signal are calculated to obtain at the least one tap signal and the expected signal, which are fed back to step S142 and step S143.

In this embodiment, the DFE includes the SSLMS algorithm device 34. More specifically, according to equations (1) and (2) below, the SSLMS algorithm device 34 may calculate and obtain the tap signal (i.e., the tap signal TAP of the multiplier 321) fed back to step S142 and the expected signal (i.e., the expected signal DLEV' of the first analog phase detector 323) fed back to step S143.

$$TAP_{n+1}^{k'} = TAP_n^{k'} - \Delta_{tap} \text{sign}(d_{n-k}) * \text{sign}(e_n) \quad (1)$$

$$DLEV_{n+1}' = DLEV_n' - \Delta_{dlev} \text{sign}(d_n) * \text{sign}(e_n) \quad (2)$$

In the above equations, k is the serial number of the tap signal, and n is a natural number. Taking the DFE in FIG. 3 for example, k is 1 to 4. Further, $\Delta_{tap}$ is the resolution of at least one tap signal fed back to the multiplier, $\Delta_{dlev}$ is the resolution fed back to the first analog phase detector DLEV', $d_n$ is the current digital signal, and $e_n$ is the current error signal.

Moreover, the DFE further includes a digital-to-analog converter (DAC) 35, which converts the digital signals fed back from the SSLMS algorithm device 34 to analog signals that are then respectively fed back to the multiplier 321 and the first analog phase detector 323.

After the equalization performed by the DFE, the eye diagram of the digital signal is effectively improved, i.e., the eye width of the digital signal is further enlarged. As shown in FIG. 4, an eye diagram of an ideal digital signal is as shown by IDEAL DATA, and a poor digital signal DATA AFTER LINK is obtained after the DP signal link. The electronic apparatus adopts the above steps S110 and S120 to process the poor digital signal to obtain an auto-compensated digital signal DATA AFTER AEQ, the eye width of the eye diagram of which is enlarged compared to the original digital data DATA AFTER LINK. By equalizing the digital signal DATA AFTER AEQ, an odd signal ODD DATA AFTER DFE and an even signal EVEN DATA AFTER DFE of the digital signal are obtained. In the odd signal ODD DATA AFTER DFE, the eye width of odd eyes is enlarged, and the neighboring even eyes may deteriorate in sacrifice for improving the odd eyes. In the even signal EVEN DATA AFTER DFE, the eye width of even eyes is enlarged, and the neighboring odd eyes may deteriorate in sacrifice for improving the even eyes. Next, the odd eyes of the odd signal ODD DATA AFTER DFE and the even eyes of the even signal EVEN DATA AFTER DFE are sequentially joined to obtain the equalized digital signal DATA AFTER DFE. The eye width of the digital signal DATA AFTER DFE is further enlarged compared to the auto-compensated digital signal.

In step S150, the quality of a second eye in the eye diagram of the equalized digital signal is detected.

As described in step S120, the electronic apparatus may use a phase DAC to perform auto-scanning on the auto-compensated digital signal to obtain a second auto-scan result, i.e., eye width information of the eye diagram of the current digital signal. Taking the odd signal ODD DATA AFTER DFE of the equalized digital signal for example, the phase DAC scans two successive eyes in the eye diagram of the odd signal ODD DATA AFTER DFE, to obtain a second auto-scan result Autoscan2 results shown in FIG. 5. The phase DAC divides one clock period into ten equal phases, and obtains after the auto-scanning one set of scan results including six good phases (including four good phases for odd eyes and two good phases for even eyes) and four bad phases. Because only one eye from the clock period of the odd signal ODD DATA AFTER DFE (the clock period of the digital signal to be combined with the other eye of the clock period of the even signal EVEN DATA AFTER DFE to form the equalized digital signal) is needed, i.e., only an eye with a large eye width in the clock period is used subsequently, only eyes with large eye widths are considered for estimating the eye quality. Accordingly, the estimated eye width of two successive eyes represented by the ten phases is that, the eye width of each eye is equal to four of the phases or represented as 4/5, which is superior to the eye quality of the first san result.

In step S160, it is determined whether the quality of the second eye is superior to the quality of the first eye by the predetermined threshold.

In an embodiment where the eye quality is defined as the eye width, the electronic apparatus determines whether the second eye width representing the second eye quality is larger than the first eye width of the first eye quality by a predetermined value (e.g., three or five phases). If so, step 170 is performed; if not, steps after step S140 are repeated until time-out, followed by performing step S170.

In step S170, the equalized digital signal is outputted.

It is understandable that, the outputted digital signal is not limited to being outputted another apparatus, and may also be outputted from one circuit in the electronic apparatus to another circuit in the electronic apparatus.

Figure 5:
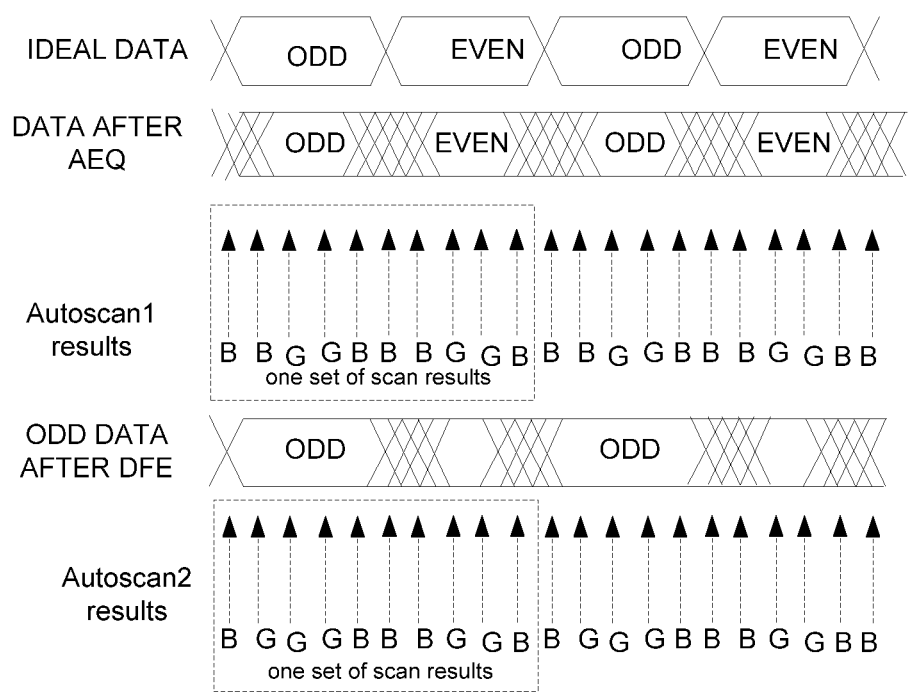
FIG. 5 is a waveform diagram of a digital signal obtained in different steps of the method of the disclosure in another application scenario.

More details on the above method are given with reference to FIG. 5. An eye diagram of an ideal digital signal is as shown by IDEAL DATA, and a poor digital signal is obtained therefrom after the ideal digital signal passes a DP signal link. The electronic device adopts the above steps S110 and S120 to process the poor digital signal to obtain an auto-compensated signal DATA AFTER AEQ, the eye diagram of which is improved. At this point, the first auto-scan result AutoScan1 results is obtained by auto-scanning the digital signal DATA AFTER AEQ—in the clock period including two eyes, ten phases are scanned, which include four good phases and six bad phases; that is, the eye width of the clock period is two phases. The DFE equalizes the digital signal DATA AFTER AEQ to obtain the odd signal and even signal of the digital signal. Taking the odd signal ODD DATA AFTER DFE for example, a second auto-scan result are obtained by auto-scanning the odd signal ODD DATA AFTER DFE—in the clock including two eyes, ten phases are scanned, wherein one eye has four good phases and the other eye has two good phases. As analyzed above, only one good eye needs to be retrieved from the clock period of each of the odd signal and the even signal to join and form two eyes of the clock period of the digital signal, and so the eye width of the clock period of the digital signal is four phases (the number of phases of superior eyes). It is determined whether an eye width difference between the first scan result and the second scan result is greater than or equal to three phases. If so, it is determined that the DFE operates correctly, the equalization achieves an ideal effect, the digital signal can be outputted, and the process ends. If not, it means that the equalization does not achieve an ideal effect, and DFE is repeated on the digital signal after the DFE, scanning is again performed to obtain a new second scan result, and the new second scan result is compared with the first scan result to perform the above steps according to the comparison result.

It is understandable that, in other embodiments, the electronic apparatus may omit at least one of the steps S110 and S120. For example, after performing step S110, the electronic apparatus directly performs steps S140 to S170 without performing the auto-compensation step of step S120; alternatively, the electronic apparatus directly starts performing steps S140 to S170 without performing steps S110 and S120.

In the method of the above embodiment, the eye quality of the eye diagram of the digital signal is improved by equalizing the digital signal. The eye qualities of the digital signal before and after the equalization are scanned and compared, and if the eye quality of the equalized digital signal is not superior to the eye quality of the digital signal before the equalization by a predetermined threshold, the equalization is continuously performed. Only when the eye quality of the final equalized digital signal is superior to the eye quality of the digital signal before the equalization by the predetermined threshold, the digital signal is outputted, hence effectively improving the eye quality of the eye diagram of the digital signal.

Further, before equalizing the digital signal, the digital signal is auto-compensated to first improve the eye quality before the equalization so as to reduce the number of times of equalization needed.

Figure 6:
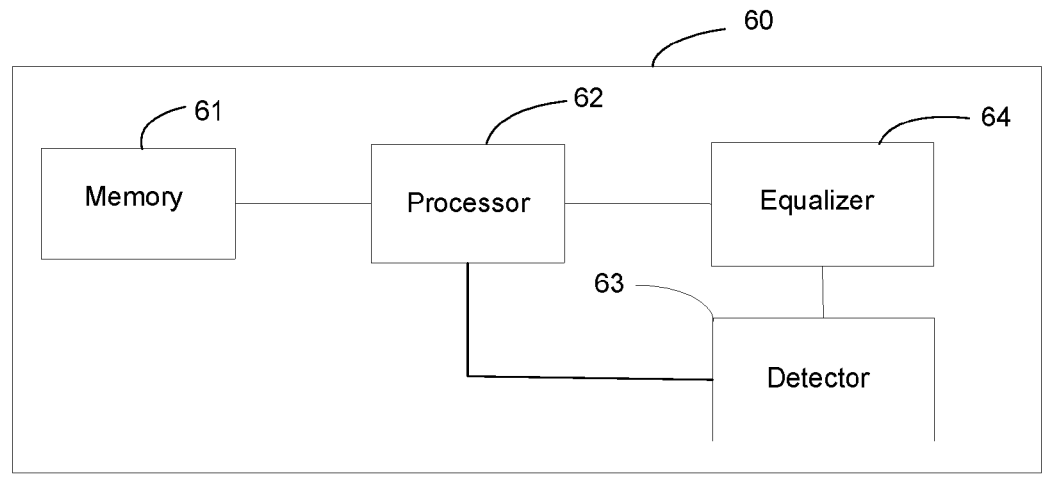
FIG. 6 is a block diagram of an electronic apparatus according to an embodiment of the disclosure.

FIG. 6 shows a block diagram of an electronic apparatus according to an embodiment of the application. In this embodiment, the electronic apparatus 60 includes a memory 61, a processor 62, a detector 63 and an equalizer 64. The processor 62 is connected to the memory 61, the detector 63 and the equalizer 64. The equalizer 64 is connected to the detector 63. In another embodiment, the components of the electronic apparatus 60 may be coupled to one another through a bus. In addition to a data bus, the bus may include a power bus, a control bus or a state signal bus.

The memory 61 stores a computer instruction executed by the processor 62, and further stores data of the processor 62 during a process. The memory 61 includes a non-volatile storage part for storing the above computer instruction. In another embodiment, the memory 61 may serve as a memory of the processor to buffer the computer instruction executed by the processor 62. The computer instruction is stored in an external device of the electronic apparatus 60, and the processor 62 accesses the computer instruction externally stored by the external device connected to perform a corresponding process. Known to one person skilled in the art, the memory 61 may be outside the electronic apparatus 60. In the application, the memory is disposed in the electronic apparatus 60 as an example, which is not to be construed as a limitation to the application.

The detector 63 detects the quality of a first eye in an eye diagram of a digital signal.

The equalizer 64 equalizes the digital signal.

The detector 63 further detects the quality of a second eye of the equalized digital signal. More specifically, the detector 63 performs the detection after receiving an execution instruction issued from the processor 62.

The processor 62 controls operations of the apparatus. The processor 62 is also referred to as a central processing unit (CPU), and may be an integrated circuit (IC) with a signal processing capability. Further, the processor 62 may be a universal processor, a digital signal processor (DSP), an application-specific integrated circuit (ASIC), a field programmable gate array (FPGA) or other programmable design logic component, a separate gate or transistor logic device, or a separate hardware component. The universal processor may be a microprocessor, or the processor may be any standardized processor.

In this embodiment, the processor 62, by accessing the computer instruction stored in the memory 61, performs operations of: determining whether the quality of the second eye is superior to the quality of the first eye by the predetermined threshold, and outputting the digital signal if so; and if not, causing the equalizer 64 to again equalize the digital signal, the detector 63 to again detect the quality of the second eye in the eye diagram of the equalized digital signal, again performing the current operation, i.e., determining whether the quality of the second eye is superior to the quality of the first eye by the predetermined threshold, and performing a corresponding process according to the determination result.

The detector 63 is selectively a phase DAC. More specifically, the detector 63 performs auto-scanning on the digital signal to obtain eye width information of the eye diagram of the digital signal. For example, the detector 63 scans the digital signal before the equalization to obtain a first eye width, and scans the equalized signal to obtain a second eye width.

The equalizer 64 is selectively a DFE. Referring to FIG. 3, more specifically, the DFE 30 includes a sampler 321, an odd channel 32a, an even channel 32b, a multiplexer 33, a calculation circuit 34 and a DAC 35. The calculation circuit 34 is an SSLMS algorithm device; each of the odd channel 32a and the even channel 32b includes at least one multiplier 321, an adder 322, a first analog phase detector 323 and a second analog phase detector 324.

The sampler 31 samples the digital signal to obtain a first odd-channel signal and a first even-channel signal, and respectively outputs the two signals from two output ends to the two adders 322.

The multiplier 321 is connected to a first feedback end of the calculation circuit 34, multiplies a tap signal Tap outputted from the first feedback end with a delayed digital signal D to obtain a product signal, and outputs the product signal to the adder 322 of the located channel. Delay periods of the delay digital signal corresponding to different multipliers in one channel are different.

The adder 322 is connected to an output end of the sampler 31 and the multiplier 321 of the located channel. The adder 322 of the odd channel 32a adds the product signals of all of the multipliers 321 of the located channel with the first odd-channel signal to obtain a second odd-channel signal, and the adder 322 of the odd channel 32b adds the product signals of all of the multipliers 321 of the located channel with the first even-channel signal to obtain the second even-channel signal.

The first analog phase detector 323 is connected to an output end of the adder 322 of the located channel and a feedback end of the calculation circuit 34. The first analog phase detector 323 of the odd channel 32a further obtains a first error signal according to an expected signal outputted from the feedback end and the second odd-channel signal, and the first phase detector 323 of the even channel 32b further obtains a second error signal according to the expected signal outputted from the feedback end and the second even-channel signal.

The second analog phase detector 324 is connected to an output end of the adder 322 of the located channel. The odd channel 32a of the second analog phase detector 324 obtains an odd signal corresponding to the digital signal according to the inputted second odd-channel signal, and the second analog phase detector 324 of the even channel 32b obtains an even signal corresponding to the digital signal according to the inputted second even-channel signal.

The multiplexer 33 is connected to the first analog phase detector 323 and the second analog phase detector 324, and generates a parallel restored signal from the odd signal and the even signal and generates a parallel error signal from the first error signal and the second error signal.

The calculation circuit 34 is connected to the multiplexer 33, the multiplier 321 and the first analog phase detector 324, uses the SSLMS algorithm to calculate the parallel restored signal and the parallel error signal to obtain at least one tap signal and an expected signal, and respectively feeds the at least one tap signal and the expected signal to the multiplier 321 and the first analog phase detector 323.

Specific operation process of the DFE can be referred from the description associated with the method of the above embodiment.

Figure 7:
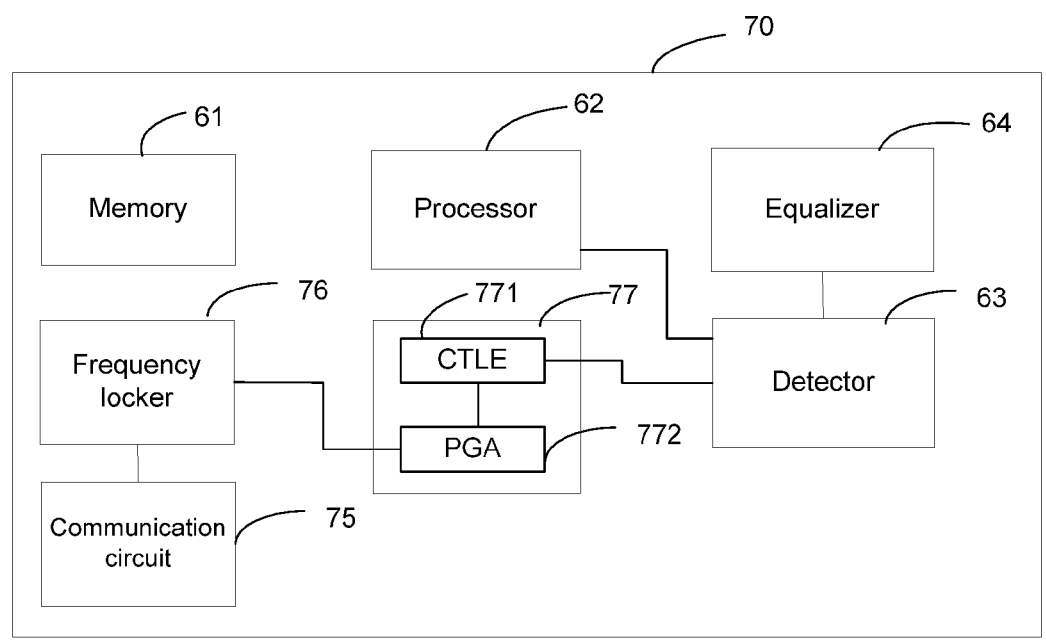
FIG. 7 is a block diagram of an electronic apparatus according to another embodiment of the disclosure.

Referring to FIG. 7, in addition to the above components, the electronic apparatus further includes a frequency locker 76, an auto-compensator 77 and a communication circuit 75. The frequency locker 76 locks the frequency of the digital signal. The auto-compensator 77 is connected to the frequency locker 77, and performs auto-compensation on the frequency locked digital signal. The detector 63 is connected to the auto-compensator 77, and detects the quality of the first eye in the eye diagram of the auto-compensated digital signal. The communication circuit 75 communicates with other apparatuses, and includes a transmitter and a receiver. In this embodiment, the communication circuit 75 is connected to the frequency locker 76, and outputs the digital signal to the frequency locker 76 to cause the frequency locker 76 to lock the frequency of the digital signal.

Further, the auto-compensator 77 includes a continuous time linear equalizer (CTLE) 771 and a programmable gain amplifier (PGA) 772.

It is understandable that, in an actual application, the electronic apparatus includes only one or two of the frequency locker 76, the auto-compensator 77 and the communication circuit 78 in addition to the components shown in FIG. 6. Further, one or multiple of the detector 63, the equalizer 64, the frequency locker 76, the auto-compensator 77 may be integrated in the processor 62, which executes a corresponding to instruction to implement an associated function. Details of the above components of the electronic apparatus may be referred from the description associated with the method of the above embodiment.

The disclosure further provides an electronic apparatus including the above memory and processor. The processor performs the method of the above embodiment, or performs only steps S160 and S170 of the method of the above embodiment.

In the above solutions, the electronic apparatus equalizes the digital signal to improve the eye quality of the eye diagram of the digital signal. The qualities of the eyes obtained before and after equalizing the digital signal are compared, and the digital signal is again equalized if the quality of the eyes of the equalized digital signal is not superior to the quality of the eyes of the digital signal before the equalization by a predetermined threshold. Only when the quality of the eyes of the final equalized digital signal is superior to the quality of the eyes of the digital signal before the equalization by the predetermined threshold, the digital signal is outputted, thus significantly improving the quality of the eyes of the digital signal.

In the above description, details of various specific system structures, interfaces and technologies are given to better understand the disclosure. However one person skill in the art can understand that, the disclosure can be implemented by other embodiments excluding these specific details. In other situations, details of generally known devices, circuits and methods are omitted to prevent unnecessary details from obscuring the description of the disclosure.

What is claimed is:

1. A processing method for a digital signal, comprising:
   detecting a quality of a first eye in an eye diagram of a digital signal, comprising auto-compensating the digital signal, and detecting the quality of the first eye in the eye diagram of the auto-compensated digital signal;
   equalizing the digital signal, comprising equalizing the auto-compensated digital signal;
   detecting a quality of a second eye in the eye diagram of the digital signal;
   determining whether the quality of the second eye is superior to the quality of the first eye by a predetermined threshold; and
   outputting the digital signal if the quality of the second eye is superior to the quality of the first eye by the predetermined threshold, or else repeating the step of equalizing the digital signal and the subsequent steps.

2. The processing method according to claim 1, wherein the digital signal is equalized by decision feedback equalization (DFE).

3. The processing method according to claim 2, wherein the step of equalizing the digital signal comprises:
   sampling the digital signal to obtain a first odd-channel signal and a first even-channel signal;
   multiplying at least one tap signal by a delayed digital signal to obtain at least one product signal, adding the at least one product signal with the first odd-channel signal to obtain a second odd-channel signal, and adding the at least one product signal with the first even-channel signal to obtain a second even-channel signal;
   according to an expected signal, separating a first error signal and an odd signal from the second odd-channel signal, and separating a second error signal and an even signal from the second even-channel signal;

generating a parallel restored signal from the odd signal and the even signal, and generating a parallel error signal from the first error signal and the second error signal; and using a sign-sign least mean square (SSLMS) algorithm to calculate the parallel restored signal and the parallel error signal to obtain the least one tap signal and the expected signal, and feeding the at least one tap signal and the expected signal back to the multiplication step and the separation step.

4. The processing method according to claim 1, wherein the step of auto-compensating the digital signal comprises:
auto-compensating the digital signal by using a continuous time linear equalizer (CTLE) and a programmable gain amplifier (PGA).

5. The processing method according to claim 1, before the step of detecting the quality of the first eye in the eye diagram of the digital signal, further comprising:
locking a frequency of the digital signal.

6. An electronic apparatus, connected to a memory, comprising:
a detector, detecting a quality of a first eye in an eye diagram of a digital signal, wherein the detector is a phase digital-to-analog converter (DAC), and performs auto-scanning on the digital signal to obtain eye width information of the eye diagram of the digital signal;
an equalizer, connected to the detector, equalizing the digital signal, wherein the detector further detects a quality of a second eye in the eye diagram of the equalized digital signal; and
a processor, connected to the detector and the equalizer, executing a computer instruction to perform operations of:
determining whether the quality of the second eye is superior to the quality of the first eye by a predetermined threshold;
outputting the digital signal if the quality of the second eye is superior to the quality of the first eye by the predetermined threshold; and
causing the equalizer to again equalize the digital signal and to detect the quality of the second eye in the eye diagram of the equalized digital signal if the quality of the second eye is not superior to the quality of the first eye by the predetermined threshold, and then determining whether the quality of the second eye is superior to the quality of the first eye by the predetermined threshold, and performing a corresponding process according to a determination result.

7. The electronic apparatus according to claim 6, wherein the equalizer is a decision feedback equalizer, and comprises:
a sampler, sampling the digital signal to obtain a first odd-channel signal and a first even-channel signal, and respectively outputting the first odd-channel signal and the first even-channel signal from two output ends;
at least one multiplier, connect to a first feedback end of a calculation circuit, each multiplier multiplying a tap signal outputted from the first feedback end with a delayed digital signal to obtain a product signal, wherein delay periods of the delayed digital signal corresponding to different multipliers are different;
two adders, respectively connected to two output ends of the sampler and connected to the at least one multiplier, adding the at least one product signal with the first odd-channel signal to obtain a second odd-channel signal, and adding the at least one product with the first even-channel signal to obtain a second even-channel signal;

two first analog phase detectors, respectively connected to output ends of the two adders and both connected to a second feedback end of the calculation circuit, obtaining a first error signal according to an expected signal outputted from the second feedback end and the second odd-channel signal, and obtaining a second error signal according to the expected signal outputted from the second feedback end and the second even-channel signal;

two second analog phase detectors, respectively connected to the output ends of the two adders, obtaining an odd signal according to the inputted second odd-channel signal, and obtaining an even signal according to the inputted second even-channel signal;

a multiplexer, connected to the first analog phase detectors and the second analog phase detectors, generating a parallel restored signal from the odd signal and the even signal, and generating a parallel error signal from the first error signal and the second error signal; and the calculation circuit, connected to the multiplexer, the multiplier and the first analog phase detectors, using a sign-sign least mean square (SSLMS) algorithm to calculate the parallel restored signal and the parallel error signal to obtain the at least one tap signal and the expected signal, and respectively feeding the at least one tap signal and the expected signal back to the multiplier and the first analog phase detectors.

8. The electronic apparatus according to claim 6, further comprising:
a frequency locker, locking the frequency of the digital signal; and
an auto-compensator, performing auto-compensation on the frequency locked digital signal;
wherein, the detector detects the quality of the first eye in the eye diagram of the auto-compensated digital signal, and the equalizer equalizes the auto-compensated digital signal.

9. The electronic apparatus according to claim 8, wherein the auto-compensator comprises a continuous time linear equalizer (CTLE) and a programmable gain amplifier (PGA).

10. The processing method for a digital signal, comprising:
detecting a quality of a first eye in an eye diagram of a digital signal;
equalizing the digital signal;
detecting a quality of a second eye in the eye diagram of the digital signal, comprising performing auto-scanning on the equalized digital signal to obtain a second eye width of the equalized digital signal;
determining whether the quality of the second eye is superior to the quality of the first eye by a predetermined threshold, comprising determining whether the second eye width is greater than the second eye width by a predetermined value; and
outputting the digital signal if the quality of the second eye is superior to the quality of the first eye by the predetermined threshold, or else repeating the step of equalizing the digital signal and the subsequent steps.

* * * * *